US009368509B2

(12) United States Patent
Pang et al.

(10) Patent No.: US 9,368,509 B2
(45) Date of Patent: Jun. 14, 2016

(54) THREE-DIMENSIONAL MEMORY STRUCTURE HAVING SELF-ALIGNED DRAIN REGIONS AND METHODS OF MAKING THEREOF

(71) Applicant: SanDisk Technologies, Inc., Plano, TX (US)

(72) Inventors: Liang Pang, Fremont, CA (US); Jayavel Pachamuthu, San Jose, CA (US); Yingda Dong, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 31 days.

(21) Appl. No.: 14/514,925

(22) Filed: Oct. 15, 2014

(65) Prior Publication Data

US 2016/0111437 A1   Apr. 21, 2016

(51) Int. Cl.
| H01L 21/336 | (2006.01) |
| H01L 29/76 | (2006.01) |
| G11C 11/34 | (2006.01) |
| H01L 27/115 | (2006.01) |
| H01L 29/51 | (2006.01) |
| H01L 29/417 | (2006.01) |
| H01L 21/223 | (2006.01) |
| H01L 21/768 | (2006.01) |

(52) U.S. Cl.
CPC ...... *H01L 27/11582* (2013.01); *H01L 21/2236* (2013.01); *H01L 21/76802* (2013.01); *H01L 21/76877* (2013.01); *H01L 27/1157* (2013.01); *H01L 29/41741* (2013.01); *H01L 29/511* (2013.01); *H01L 29/518* (2013.01)

(58) Field of Classification Search
CPC .................. H01L 27/11585; H01L 21/28291; H01L 29/41741

USPC .......... 438/268; 257/314; 365/185.1
See application file for complete search history.

(56) References Cited

U.S. PATENT DOCUMENTS

| 5,915,167 A | 6/1999 | Leedy | |
| 2008/0173928 A1* | 7/2008 | Arai | H01L 29/7926 257/316 |
| 2009/0121271 A1* | 5/2009 | Son | H01L 21/8221 257/315 |
| 2010/0133606 A1* | 6/2010 | Jang | H01L 27/11551 257/329 |
| 2010/0163968 A1 | 7/2010 | Kim et al. | |
| 2011/0069552 A1 | 3/2011 | Itagaki et al. | |
| 2011/0076819 A1* | 3/2011 | Kim | H01L 27/11551 438/279 |

(Continued)

OTHER PUBLICATIONS

Endoh, et al., "Novel Ultra High Density Memory with a Stacked-Surrounding Gate Transistor (S-SGT) Structured Cell," IEDM Proc. (2001) 33-36.

(Continued)

*Primary Examiner* — Moazzan Hossain
(74) *Attorney, Agent, or Firm* — The Marbury Law Group PLLC

(57) ABSTRACT

A memory stack structure can be formed through a stack of an alternating plurality of first material layers and second material layers and through an overlying temporary material layer having a different composition than the first and second material layers. The memory stack structure can include a memory film and a semiconductor channel layer. The overlying temporary material layer is removed selective to the stack to form a lateral recess. Portions of the memory film are removed around the lateral recess, and dopants are laterally introduced into an upper portion of the semiconductor channel to form a self-aligned drain region.

8 Claims, 17 Drawing Sheets

(56) References Cited

U.S. PATENT DOCUMENTS

| | | | |
|---|---|---|---|
| 2012/0049268 A1 | 3/2012 | Chang et al. | |
| 2012/0112260 A1 | 5/2012 | Kim et al. | |
| 2012/0299117 A1 | 11/2012 | Lee et al. | |
| 2013/0089974 A1 | 4/2013 | Lee et al. | |
| 2013/0095646 A1* | 4/2013 | Alsmeier | H01L 27/11551 438/594 |
| 2013/0168752 A1* | 7/2013 | Kim | H01L 27/11582 257/314 |
| 2013/0248974 A1* | 9/2013 | Alsmeier | G11C 16/04 257/321 |
| 2014/0070302 A1 | 3/2014 | Yoo et al. | |
| 2014/0126290 A1* | 5/2014 | Sakui | H01L 29/7889 365/185.05 |
| 2014/0197469 A1* | 7/2014 | Lee | H01L 27/1052 257/296 |

OTHER PUBLICATIONS

Invitation to Pay Additional Fees, International Application No. PCT/US2015/051175, issued Dec. 17, 2015, 7pgs.

International Search Report and Written Opinion of International Searching Authority for International Application No. PCT/US2015/051175, issued Mar. 14, 2016, 24 pages.

* cited by examiner

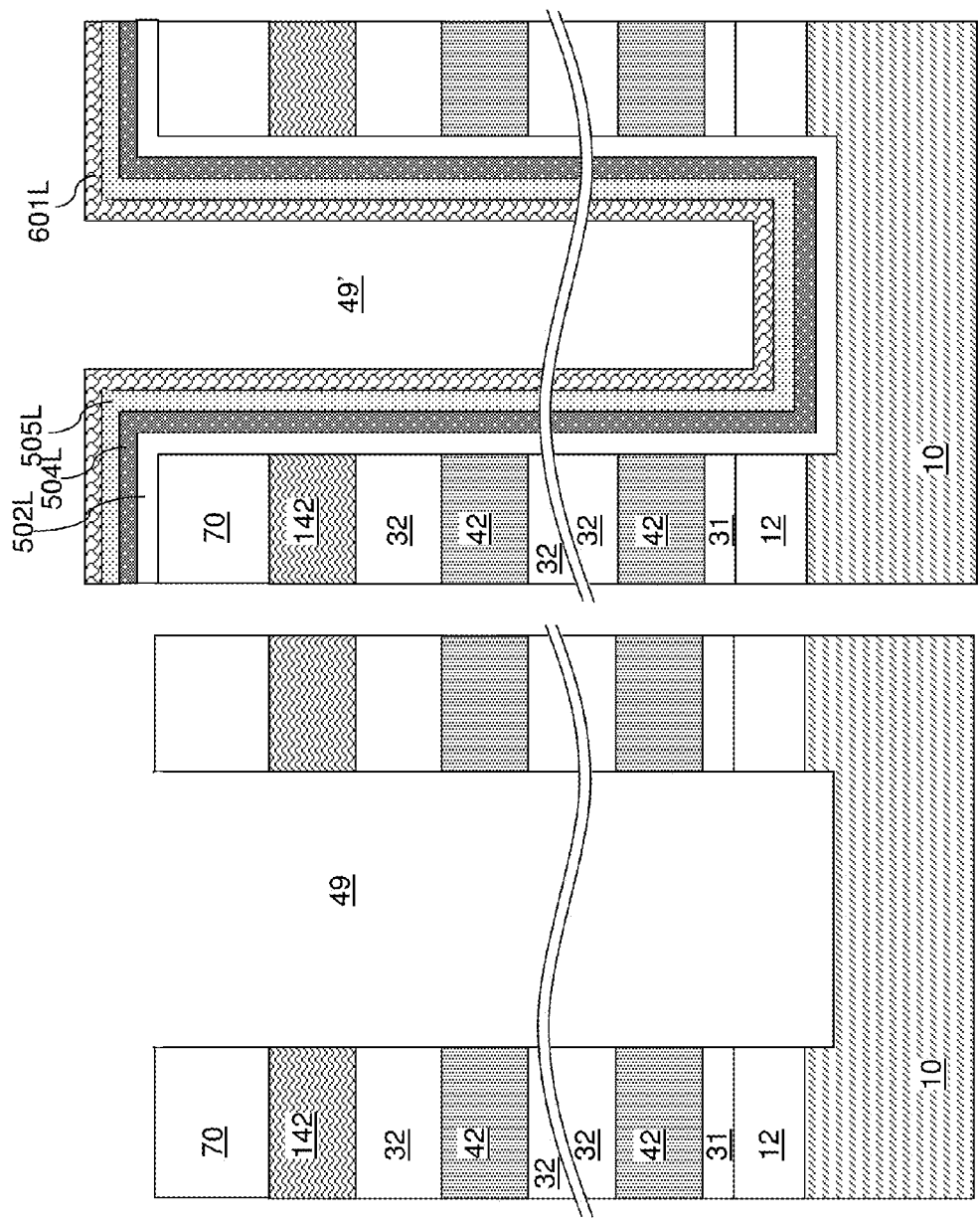

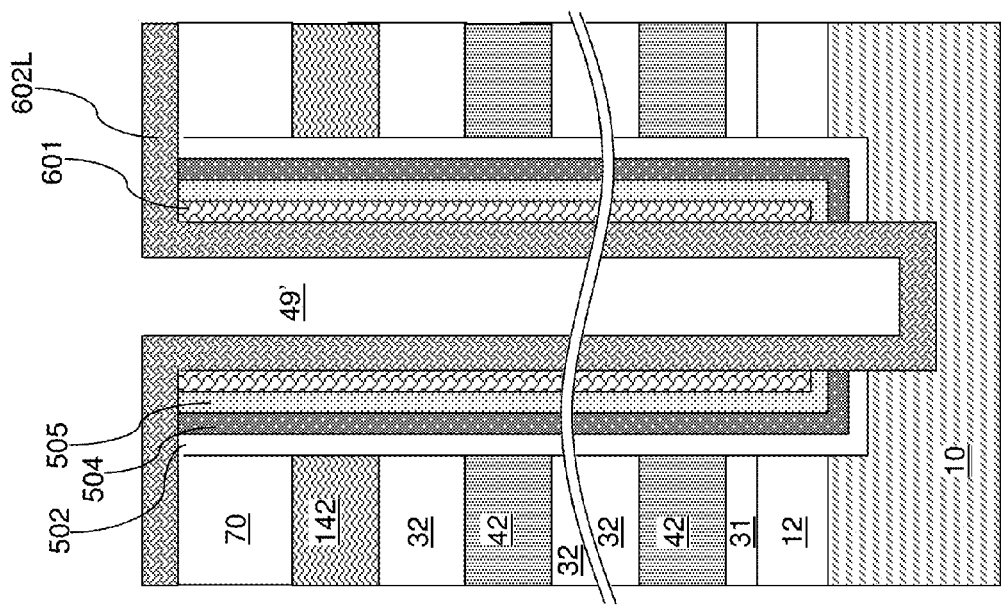
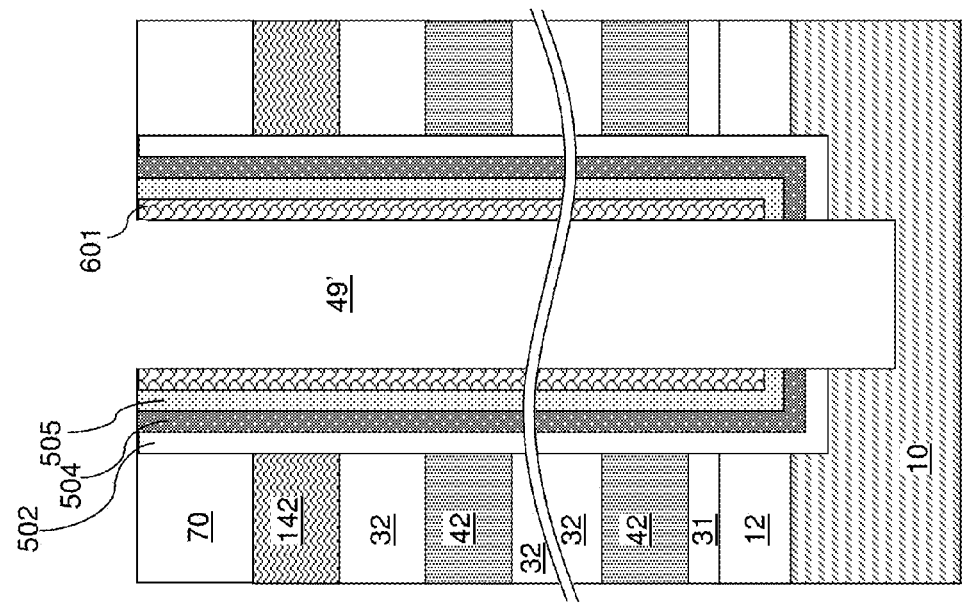

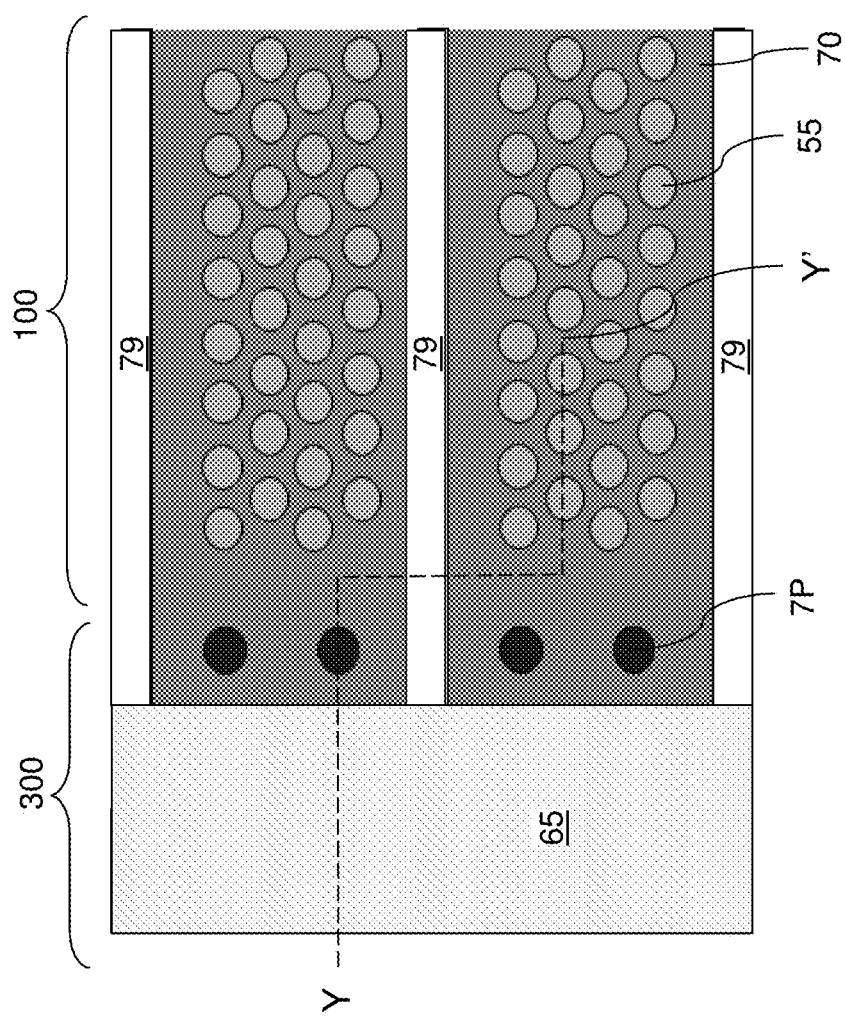

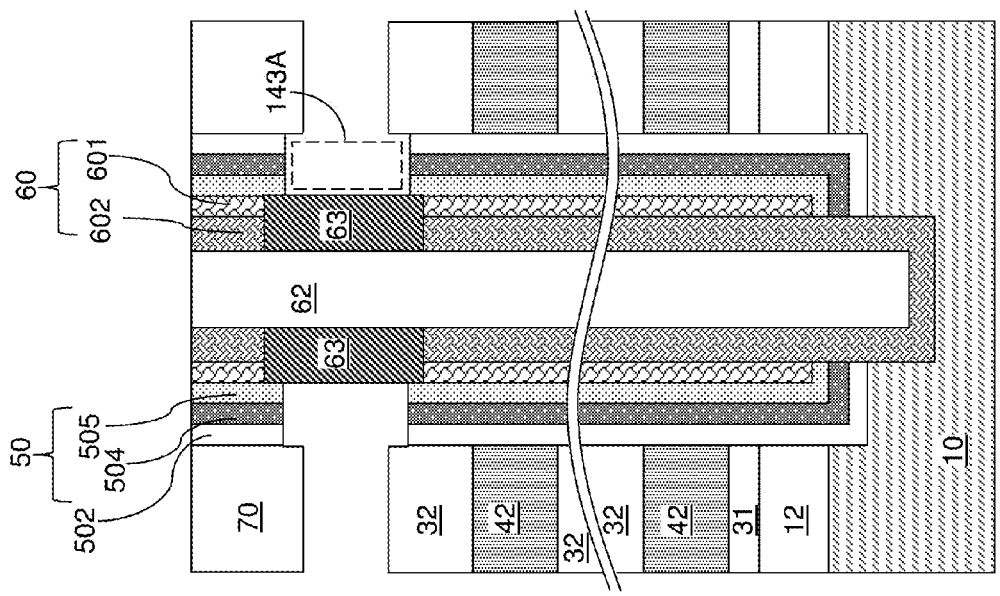
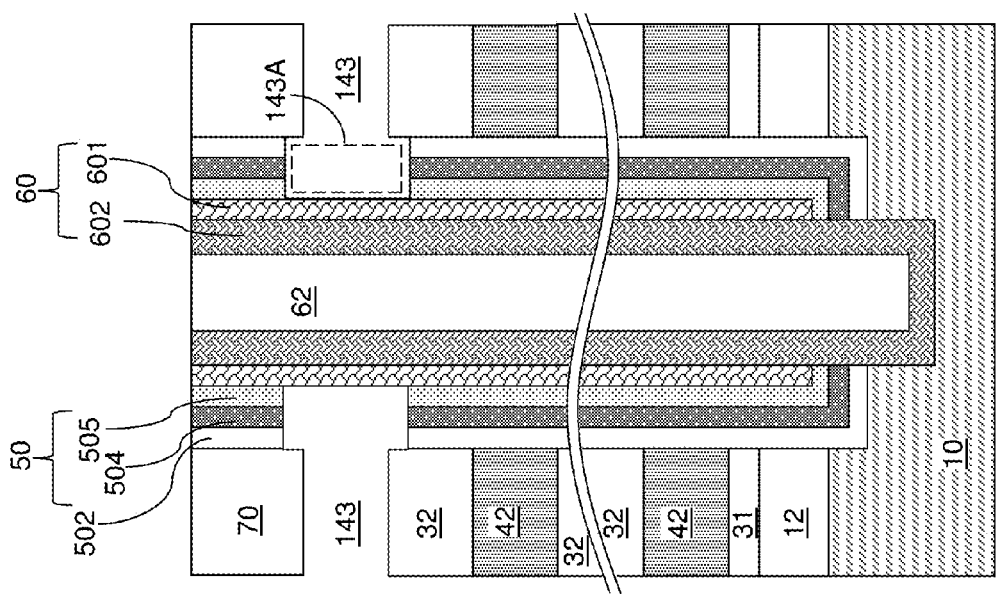
FIG. 7A
FIG. 7B

THREE-DIMENSIONAL MEMORY STRUCTURE HAVING SELF-ALIGNED DRAIN REGIONS AND METHODS OF MAKING THEREOF

FIELD

The present disclosure relates generally to the field of semiconductor devices and specifically to three-dimensional memory structures, such as vertical NAND strings, and other three-dimensional devices and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory structure is provided, which comprises a stack including an alternating plurality of insulator layers and electrically conductive layers located over a substrate, a memory opening extending through the stack, and a memory film and a semiconductor channel located within the memory opening. The semiconductor channel includes a vertical portion that extends vertically through a subset of layers within the stack. The monolithic three-dimensional memory structure further comprises a drain region having a same horizontal cross-sectional area as the vertical portion of the semiconductor channel. The drain region includes an electrical dopant of a first conductivity type.

According to another aspect of the present disclosure, a method of manufacturing a three-dimensional memory structure is provided. A stack of alternating layers comprising first material layers and second material layers is formed over a substrate. A temporary material layer is formed over the stack. A memory opening is formed through the temporary material layer and the stack. A memory film and a semiconductor channel are formed in the memory opening. A first backside recess is formed by removing the temporary material layer and a portion of the memory film that adjoins the temporary material layer. A portion of a sidewall of the semiconductor channel is physically exposed to the first backside recess. Electrical dopants are introduced through the physically exposed portion of the sidewall of the semiconductor channel, whereby a portion of the semiconductor channel is converted into a drain region.

BRIEF DESCRIPTION OF THE DRAWINGS

FIGS. 2A-2F is a sequential vertical cross-sectional view of a memory opening during formation of a memory stack structure according to an embodiment of the present disclosure.

FIG. 6B is a top-down view of the exemplary structure of FIG. 6A. The zig-zag vertical plane Y-Y' is the cut plane for the vertical cross-sectional view of FIG. 6A.

FIG. 7A is a vertical cross-sectional view of a memory stack structure after removal of a portion of a memory film and physical exposure of a portion of a semiconductor channel according to an embodiment of the present disclosure.

FIG. 7B is a vertical cross-sectional view of the memory stack structure after formation of a drain region according to an embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
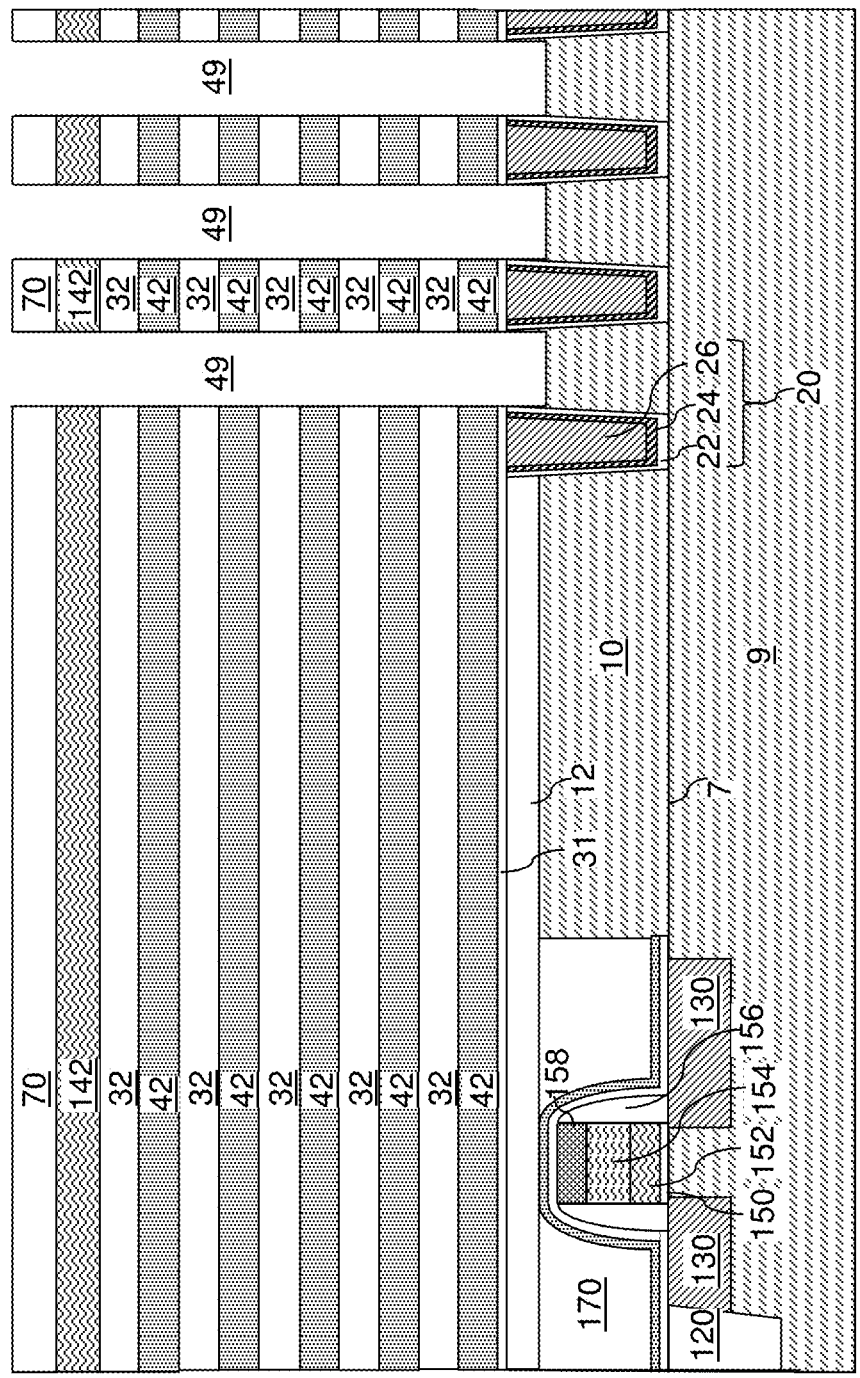
FIG. 1 is a vertical cross-sectional view of an exemplary structure after formation of a stack of alternating plurality of material layers and memory openings according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-5}$ Ohm-cm to $1.0 \times 10^5$ Ohm-cm, and is capable of producing a doped material having electrical conductivity in a range from 1 Ohm-cm to $1.0 \times 10^5$ Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than 1.0 Ohm-cm. As used herein, an "insulator material" or a "dielectric material" refers to a material having electrical conductivity less than $1.0 \times 10^{-5}$ Ohm-cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 160 and a second dielectric liner 162 can be optionally formed. Each of the first and second dielectric liners (160, 162) can comprise a silicon oxide layer, a silicon nitride layer, and/or a dielectric metal oxide layer. In an illustrative example, the first dielectric liner 160 can be a silicon oxide layer, and the second dielectric liner 162 can be a silicon nitride layer.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (160, 162). Subsequently, the planarization dielectric layer 170 and the dielectric liners (160, 162) can be removed from an area to physically expose a top surface of the substrate semiconductor layer 9.

Optionally, a semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers. The alternating plurality of first material layers and second material layers end with an instance of the first material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including germanium or a silicon-germanium alloy.

In one embodiment, the insulator layers 32 can include silicon oxide, and sacrificial material layers can include silicon nitride. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes such as source select gate electrodes and drain select gate electrodes. In one embodiment, each sacrificial material layer 42 in the alternating stack (32, 42) can have a uniform thickness that is substantially invariant within each respective sacrificial material layer 42.

A temporary material layer 142 is formed over the alternating stack (32, 42). The temporary material layer 142 can be formed directly on the top surface of a topmost insulator layer 32. The temporary material layer 142 includes a material that can be removed selective to the first material of the insulator layers 32 and selective to the second material of the sacrificial material layers 42. As used herein, a "temporary material" refers to a material that is present on a structure during at least one processing step, and is removed from the structure prior to completion of the structure, i.e., prior to the termination of the last processing step.

In one embodiment, the insulator layers 32 can include silicon oxide, the sacrificial material layers 42 can include silicon nitride, and the temporary material layer 142 can include a semiconductor material. The semiconductor material of the temporary material layer 142 can be, for example, a Group IV semiconductor material, a III-V compound semiconductor material, a II-VI semiconductor material, or an organic semiconductor material. In an illustrative example, the semiconductor material can be amorphous silicon or polysilicon.

In another embodiment, the insulator layers 32 can include silicon oxide, the sacrificial material layers 42 can include a semiconductor material that can be etched selective to the semiconductor material of the semiconductor material layer 10, and the temporary material layer 142 can include silicon nitride. The semiconductor material of the sacrificial material layers 42 can be, for example, germanium, a silicon-germanium alloy, a III-V compound semiconductor material, a II-VI semiconductor material, or an organic semiconductor material.

The temporary material layer 142 can be formed, for example, by chemical vapor deposition (CVD), atomic layer deposition (ALD), or a combination thereof. The thickness of the temporary material layer 142 can be the same as the target thickness for the combination of a drain select gate line and a blocking dielectric layer, which is subsequently formed in the volume of the temporary material layer 142. For example, the thickness of the temporary material layer 142 can be in a range from 20 nm to 100 nm, although lesser and greater thicknesses can also be employed. In some embodiment, the thickness of the temporary material layer 142 can be greater than the thickness of each insulator layer 32.

Optionally, an insulating cap layer 70 can be formed over the alternating stack (32, 42). The insulating cap layer 70 includes a dielectric material that is different from the material of the sacrificial material layers 42, and from the material of the temporary material layer 142. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70, the temporary material layer 142, and the alternating stack (32, 42), and can be lithographically patterned to form openings therein. The pattern in the lithographic material stack can be transferred through the insulating cap layer 70, the temporary material layer 142, and through entirety of the alternating stack (32, 42) by at least one anisotropic etch that employs the patterned lithographic material stack as an etch mask. Portions of the insulating cap layer 70, the temporary material layer 142, and the alternating stack (32, 42) underlying the openings in the patterned lithographic material stack are etched to form memory openings 49. In other words, the transfer of the pattern in the patterned lithographic material stack through the insulating cap layer 70, the temporary material layer 142, and the alternating stack (32, 42) forms the memory openings 49 that extend through the insulating cap layer 70, the temporary material layer 142, and the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated immediately after formation thereof. The memory opening 49 extends through the insulating cap layer 70, the temporary material layer 142, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, a series of layers including at least one blocking dielectric layer 502L, a memory material layer 504L, a tunneling dielectric layer 505L, and an optional first semiconductor channel layer 601L can be sequentially deposited in the memory openings 49. The at least one blocking dielectric layer 502L can include, for example, a first blocking dielectric layer (not separately shown) and a second blocking dielectric layer (not separately shown). Alternatively, the blocking dielectric layer may be omitted from the memory opening, and instead be formed through the backside contact trench in recesses formed by removal of the sacrificial layers 42 prior to forming the metal control gate electrodes through the backside contact trench.

In an illustrative example, the first blocking dielectric layer can be deposited on the sidewalls of each memory opening 49 by a conformal deposition method. The first blocking dielectric layer includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer can include a dielectric metal oxide having a dielectric constant greater than 7.9, i.e., having a dielectric constant greater than the dielectric constant of silicon nitride. In one embodiment, the first blocking dielectric layer includes aluminum oxide. The second blocking dielectric layer can be formed on the first blocking dielectric layer. The second blocking dielectric layer can include a dielectric material that is different from the dielectric material of the first blocking dielectric layer. In one embodiment, the second blocking dielectric layer can include silicon oxide, a dielectric metal oxide having a different composition than the first blocking dielectric layer, silicon oxynitride, silicon nitride, or a combination thereof. In one embodiment, the second blocking dielectric layer can include silicon oxide.

Subsequently, the memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory hole 49 that is not filled with the deposited material layers (502L, 504L, 505L, 601L).

Referring to FIG. 2C, the optional first semiconductor channel layer 601L, the tunneling dielectric layer 505L, the memory material layer 504L, the at least one blocking dielectric layer 502L are sequentially anisotropically etched employing at least one anisotropic etch process. The portions of the first semiconductor channel layer 601L, the tunneling dielectric layer 505L, the memory material layer 504L, and the at least one blocking dielectric layer 502L located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer 502L at a bottom of each cavity 49' can be removed to form openings in remaining portions thereof. Each of the first semiconductor channel layer 601L, the tunneling dielectric layer 505L, the memory material layer 504L, and the at least one blocking dielectric layer 502L can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the at least one blocking dielectric layer is herein referred to as at least one blocking dielectric 502. A surface of the semiconductor material layer 10 can be physically exposed underneath the opening through the first semiconductor channel portion 601, the tunneling dielectric 505, the charge storage element 504, and the at least one blocking dielectric 502. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, and the at least one blocking dielectric 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2D, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2F:
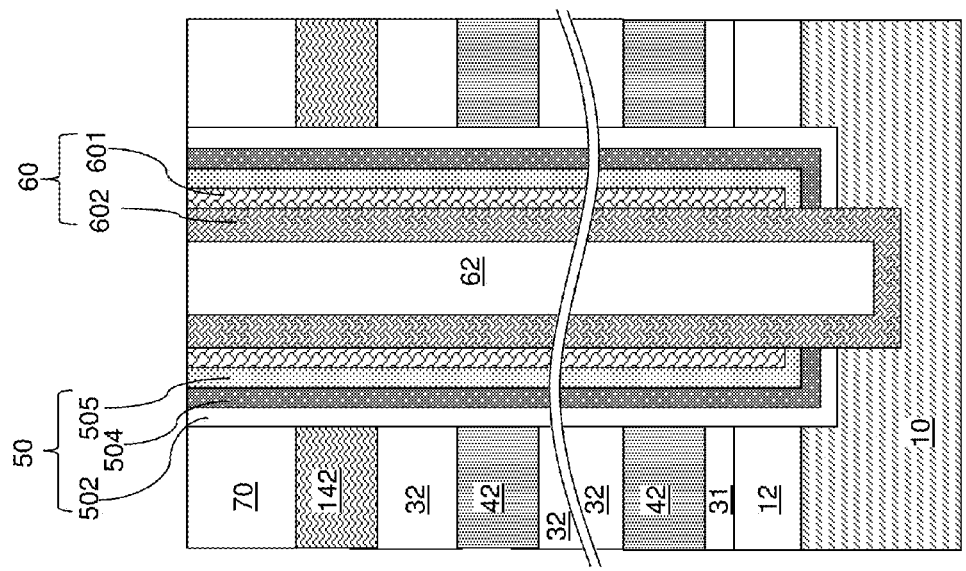
Figure 2E:
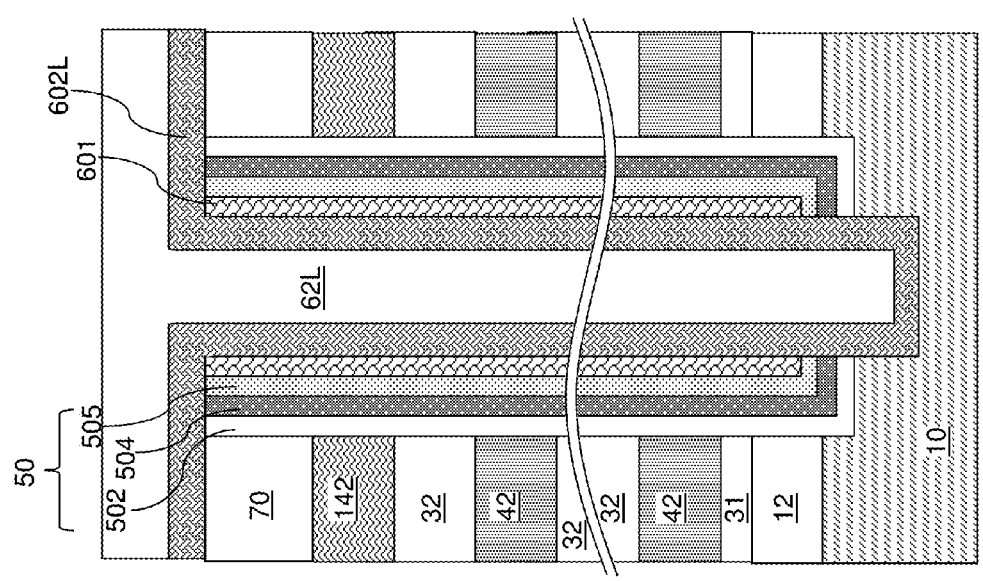

Referring to FIG. 2E, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2F, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of at least one blocking dielectric 502, a charge storage element 504, and a tunneling dielectric 505 collectively constitute a memory film 50, which can store electrical charges with a macroscopic retention time. As used herein, a macroscopic retention time refers to a retention time suitable for operation of a memory device as a permanent memory device such as a retention time in excess of 24 hours. Each remaining portion of the dielectric core layer 62L constitutes a dielectric core 62. Alternatively, the at least one blocking dielectric layer 502 may be omitted from the memory opening, and instead be formed through the backside contact trench in recesses formed as a dielectric liner by removal of the sacrificial layers 42 prior to forming the metal control gate electrodes through a backside contact trench.

Figure 3:
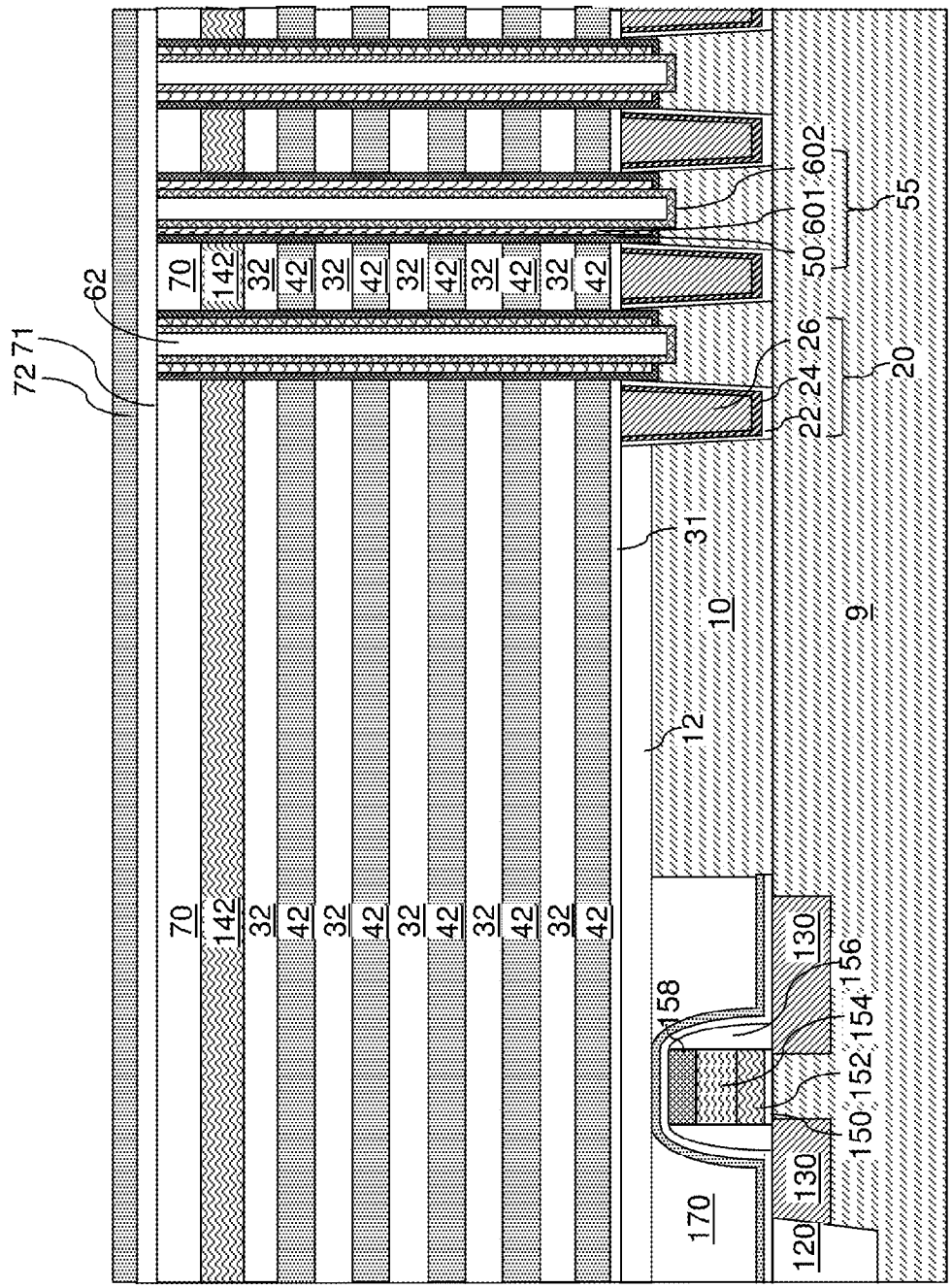
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises at least one blocking dielectric 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
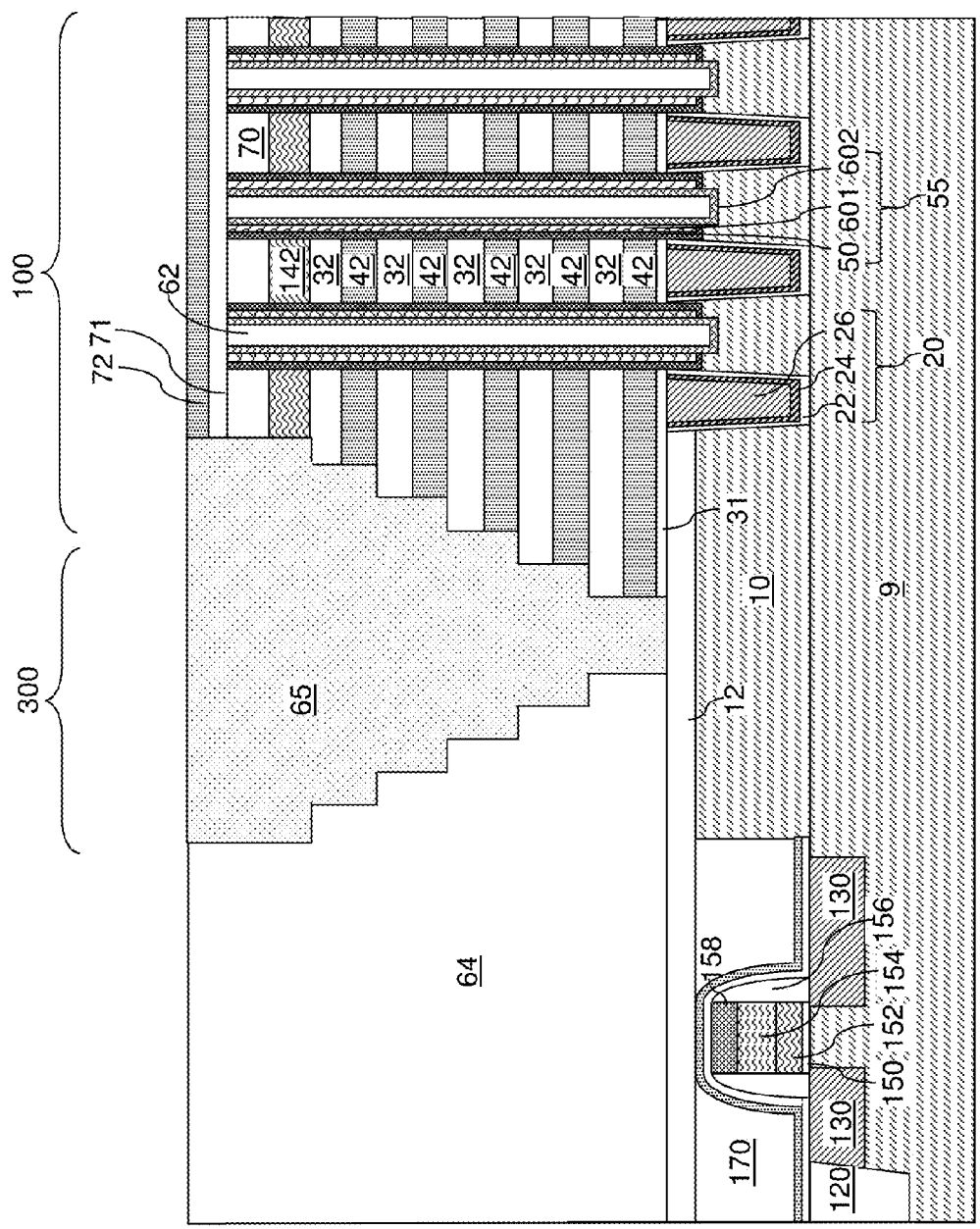
FIG. 4 is a vertical cross-sectional view of the exemplary structure after formation of a stepped terrace and a retro-stepped dielectric material portion according to an embodiment of the present disclosure.

Referring to FIG. 4, at least one dielectric cap layer (71, 72) can be optionally formed over the planarization dielectric layer 70. In one embodiment, the at least one dielectric cap layer (71, 72) can include a first dielectric cap layer (71, 72) and a second dielectric cap layer 72. In one embodiment, the first and second dielectric cap layers (71, 72) can include dielectric materials such as silicon oxide, a dielectric metal oxide, and/or silicon nitride.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed. Subsequently, the trench can be filled with an optional dielectric material such as silicon oxide. Excess portions of the dielectric material can be removed from above the top surface of the at least one dielectric cap layer (71, 72) by a planarization process such as chemical mechanical planarization and/or a recess etch. The top surfaces of the at least one dielectric cap layer (71, 72) can be employed as a stopping surface during the planarization. The remaining dielectric material in the trench constitutes a dielectric material portion 64.

A stepped cavity can be formed within a contact region 300, which is adjoined to a device region 100 including an array of memory stack structures 55. The contact region 300 can straddle the dielectric material portion 64 and a portion of the alternating stack (32, 42). Alternatively, formation of the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer (71, 72), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5:
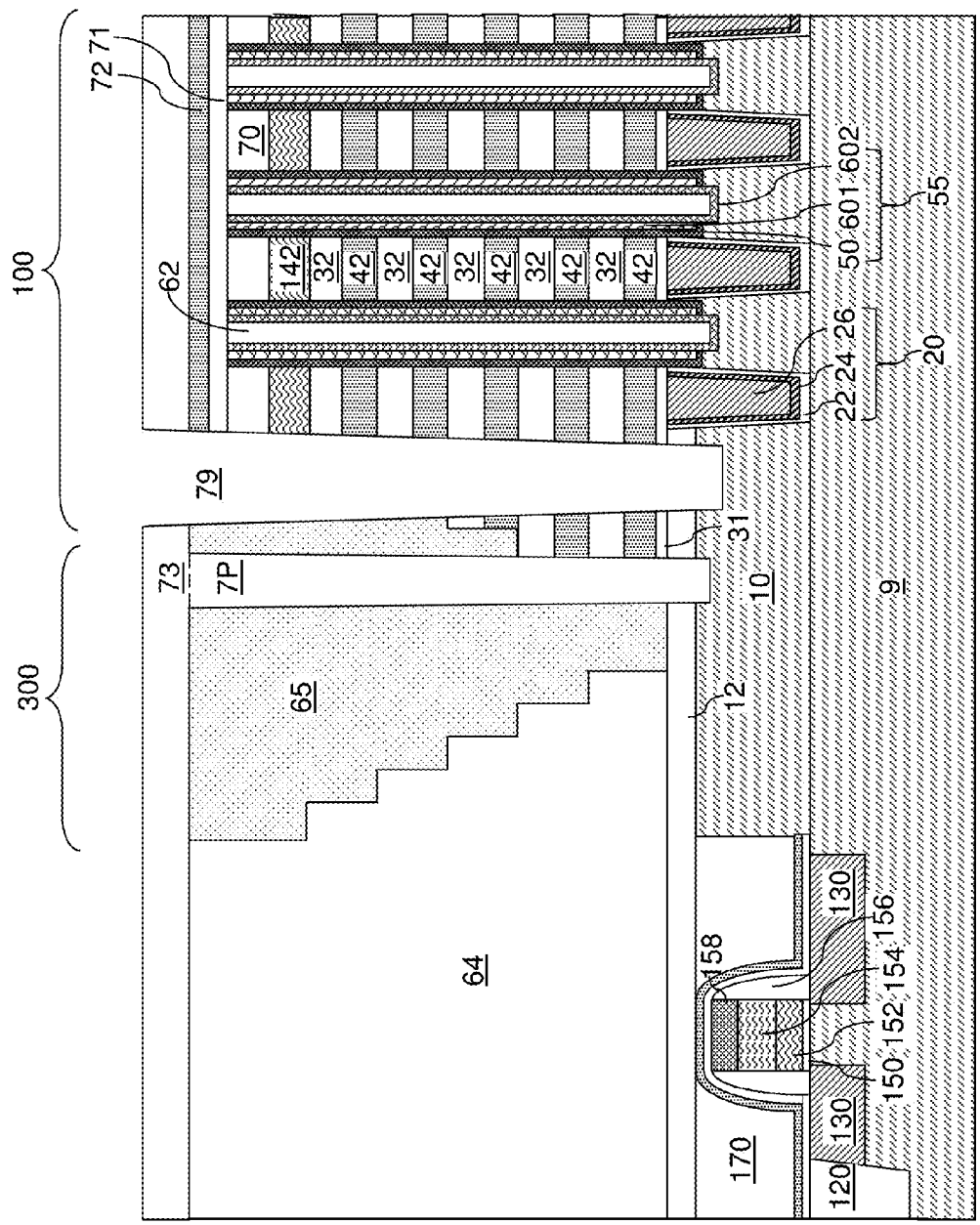
FIG. 5 is a vertical cross-sectional view of the exemplary structure after optional formation of a dielectric pillar structure and formation of a backside via cavity according to an embodiment of the present disclosure.

Referring to FIG. 5, at least one dielectric support pillar 7P may be optionally formed through the retro-stepped dielectric material portion 65 and/or through the alternating stack (32, 42). In one embodiment, the at least one dielectric support pillar 7P can be formed in a contact region 300, which is located adjacent to a device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72) concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

Figure 6A:
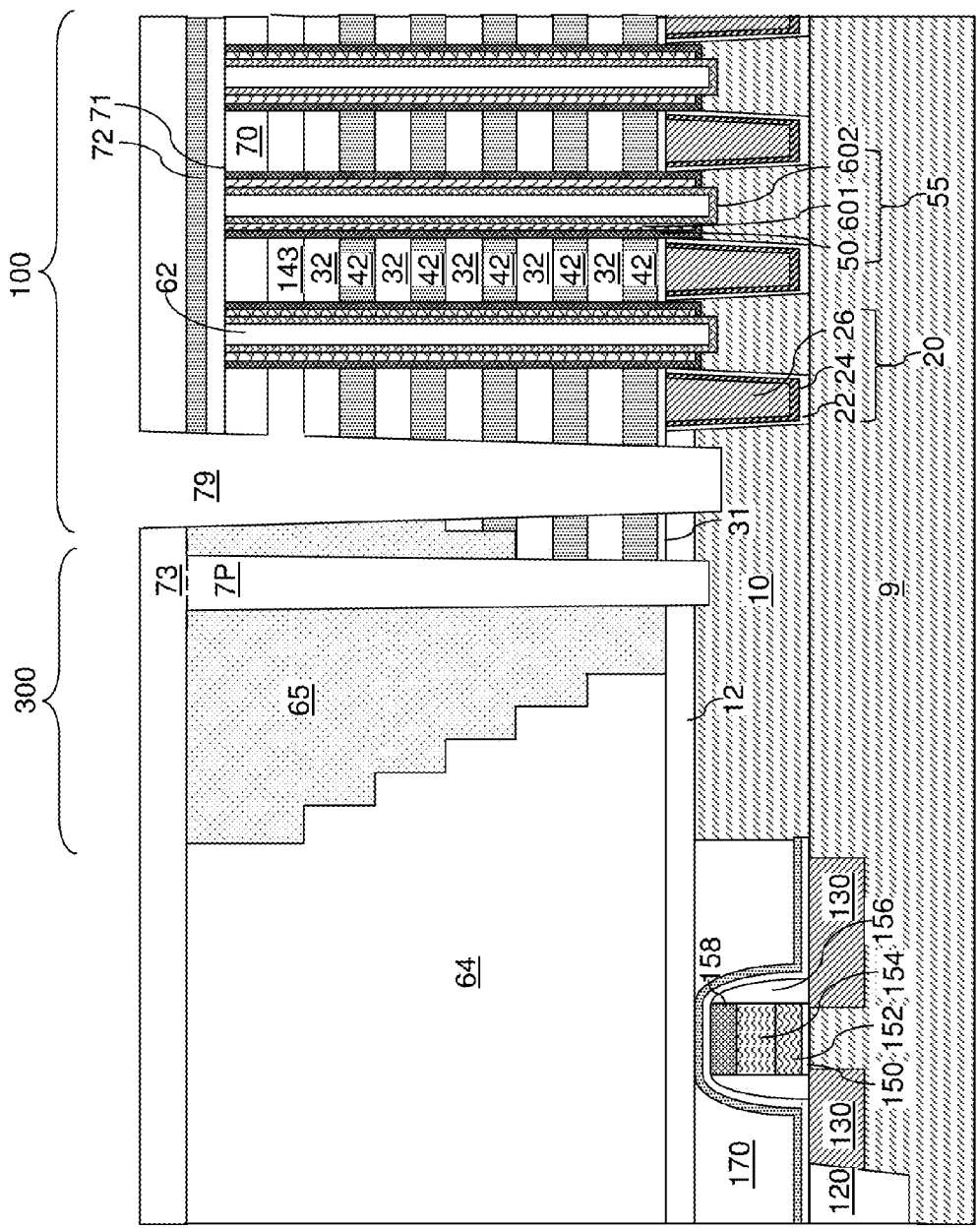
FIG. 6A is a vertical cross-sectional view of the exemplary structure after formation of a drain-select-electrode level backside recess according to an embodiment of the present disclosure.

Referring to FIGS. 6A and 6B, a first etchant that selectively etches the material of the temporary material layer 142 with respect to the first material of the insulator layers 32 and the second material of the sacrificial material layers 42 can be introduced into the at least one backside contact trench 79, for example, employing an etch process. A first backside recess is formed in the volume from which the temporary material layer 142 is removed. The first backside recess is herein referred to as a drain-level backside recess 143. The drain-level backside recess 143 is a backside recess that is located at the drain level, i.e., the level at which drain regions are to be subsequently formed. As used herein, a "front side" opening or a "front side" recess refers to an opening or a recess that is formed at the inside of a memory film 50, and a "backside" opening or a "backside" recess refers to an opening or a recess that is formed at the outside of a memory film 50 or outside of a plurality of memory films 50. In one embodiment, the removal of the material of the temporary material layer 142 can be selective to the first material of the insulator layers 32, to the second material of the sacrificial material layers 42, to the material of the at least one dielectric support pillar 7P, to the material of the retro-stepped dielectric material portion 65, and optionally to the semiconductor material of the semiconductor material layer 10.

In one embodiment, the temporary material layer 142 can include silicon nitride, and the materials of the insulator layers 32, the at least one dielectric support pillar 7P, and the retro-stepped dielectric material portion 65 can be selected from silicon oxide and dielectric metal oxides. In this case, the sacrificial material layers 42 can include a semiconductor material such as germanium, a silicon-germanium alloy, amorphous silicon, a compound semiconductor material, or an organic semiconductor material.

In another embodiment, the temporary material layer 142 can include a semiconductor material such as polysilicon, and the materials of the insulator layers 32, the at least one dielectric support pillar 7P, and the retro-stepped dielectric material portion 65 can be selected from silicon oxide and dielectric metal oxides. In this case, the sacrificial material layers 42 can include silicon nitride. Optionally, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the material of the temporary material layer 142 selective to the first material and the second material can be a wet etch process employing a wet etch solution, or can be a gas phase (dry) etch process in which the etchant is introduced in a vapor phase into the at least one backside contact trench 79. For example, if the temporary material layer 142 includes silicon nitride, the etch process can be a wet etch process in which the exemplary structure is immersed within a wet etch tank including phosphoric acid, which etches silicon nitride selective to silicon oxide, silicon, and various other materials employed in the art.

In one embodiment, the device region 100 comprises an array of monolithic three-dimensional NAND strings having a plurality of device levels disposed above the substrate (9, 10). The drain-level backside recess 143 can define a space for receiving a drain select gate electrode of the array of monolithic three-dimensional NAND strings. The drain-level backside recess 143 can extend substantially parallel to the top surface of the substrate (9, 10). The drain-level backside recess 143 can be vertically bounded by a top surface of an underlying insulator layer 32 and a bottom surface of the insulating cap layer 70. In one embodiment, the drain-level backside recess 143 can have a uniform height throughout.

Referring to FIG. 7A, a portion of each memory film 50 physically exposed to the drain-level backside recess 143 can be removed by at least one etch process, which can be a series of isotropic etch processes. The chemistry of each isotropic etch process can be selected to sequentially remove the various materials of the memory films 50 from outside to inside. If each memory film 50 includes at least one blocking dielectric 502, a charge storage region 504, and a tunneling dielectric 505, a first isotropic etch process can etch a portion of the at least one blocking dielectric 502 to expand the drain-level backside recess 143, a second isotropic etch process can etch a portion of the charge storage element 504 to further expand the drain-level backside recess 143, and a third isotropic etch process can etch a portion of the tunneling dielectric 505 to further expand the drain-level backside recess 143. At least one etch processes among the series of isotropic etch processes can be selective to materials of the insulator layers 32 and the insulating cap layer 70. The isotropic etch process that etches the material of the tunneling dielectric 505 can be selective to the material of the first semiconductor channel portion 601.

The series of isotropic etch process can form an annular cavity 143A around each memory opening as a portion of the drain-level backside recess 143. As used herein, an "annular" cavity refers to a cavity having an annular shape, i.e., the shape of an annulus (a ring). Each isotropic etch process can undercut the corresponding etched material layer from above the horizontal plane including the bottom surface of the insulating cap layer 70 and from below the horizontal plane including the top surface of the topmost insulator layer 32. Each annular cavity 143 can have a top portion that protrudes above the horizontal plane including the bottom surface of the insulating cap layer 70, and can have a bottom portion that protrudes below the horizontal plane including the top surface of the topmost insulator layer 32. During the series of isotropic etch processes, a portion of the memory film 50 that adjoins the temporary material layer 142 prior to formation of the first backside recess (i.e., the drain-level backside recess 143) is isotropically etched to expand the first backside recess above a horizontal plane including a bottom surface of the overlying dielectric layer (i.e., the insulating cap layer 70) and below another horizontal plane including a top surface of the underlying dielectric layer (i.e., the topmost insulator layer 32). A vertical surface of each semiconductor channel 60 is physically exposed after the series of isotropic etch processes.

Referring to FIG. 7B, electrical dopants can be introduced through the physically exposed portion of the sidewall of each semiconductor channel 60. The electrical dopants can be p-type dopants or n-type dopants. Exemplary p-type dopants include B, Ga, and In. Exemplary n-type dopants include P, As, and Sb. Each portion of the semiconductor channel 60 into which the electrical dopants are introduced is converted into a drain region 63.

The electrical dopants can be introduced into physically exposed portions of the semiconductor channels 60 by a plasma doping process and/or a gas phase doping process. In a plasma doping process, the exemplary structure is placed in a process chamber in which a plasma of the electrical dopants is generated. Non-limiting examples of process gases from which the plasma can be generated include $B_2H_6$, $PH_3$, $AsH_3$, and $SbH_3$. In a gas phase doping process, the exemplary structure is placed in a process chamber, and is subjected to a dopant gas at an elevated temperature, which can be, for example, in a range from 600 degrees Celsius to 1,000 degrees Celsius. The atomic concentration of the electrical dopants in each drain region 63 can be in a range from $1.0 \times 10^{19}/cm^3$ to $1.0 \times 10^{21}/cm^3$, although lesser and greater atomic concentrations can also be employed.

Within each memory opening, the drain region 63 can have a same horizontal cross-sectional shape and areas as the semiconductor channel 60. The drain region 63 includes the same semiconductor material as the remaining portions of the semiconductor channel 60, and further includes the electrical dopants. In one embodiment, the composition of the drain region 63 can differ from the composition of the semiconductor channel 60 by the presence of the electrical dopant atoms in the drain region 63, while the semiconductor channel 60 is substantially free of the electrical dopants. In another embodiment, the semiconductor channel 60 can have a doping of a first conductivity type due to presence of electrical dopants of the first conductivity type therein, and the drain region 63 can have a doping of a second conductivity type that is the opposite type of the first conductivity type. The drain region 63 can include electrical dopants of the second conductivity type and the first conductivity type such that the atomic concentration of the first conductivity type therein is the same as the atomic concentration of the first conductivity type within the semiconductor channel 60, and is less than the atomic concentration of the second conductivity type within the drain region 63.

Figure 8:
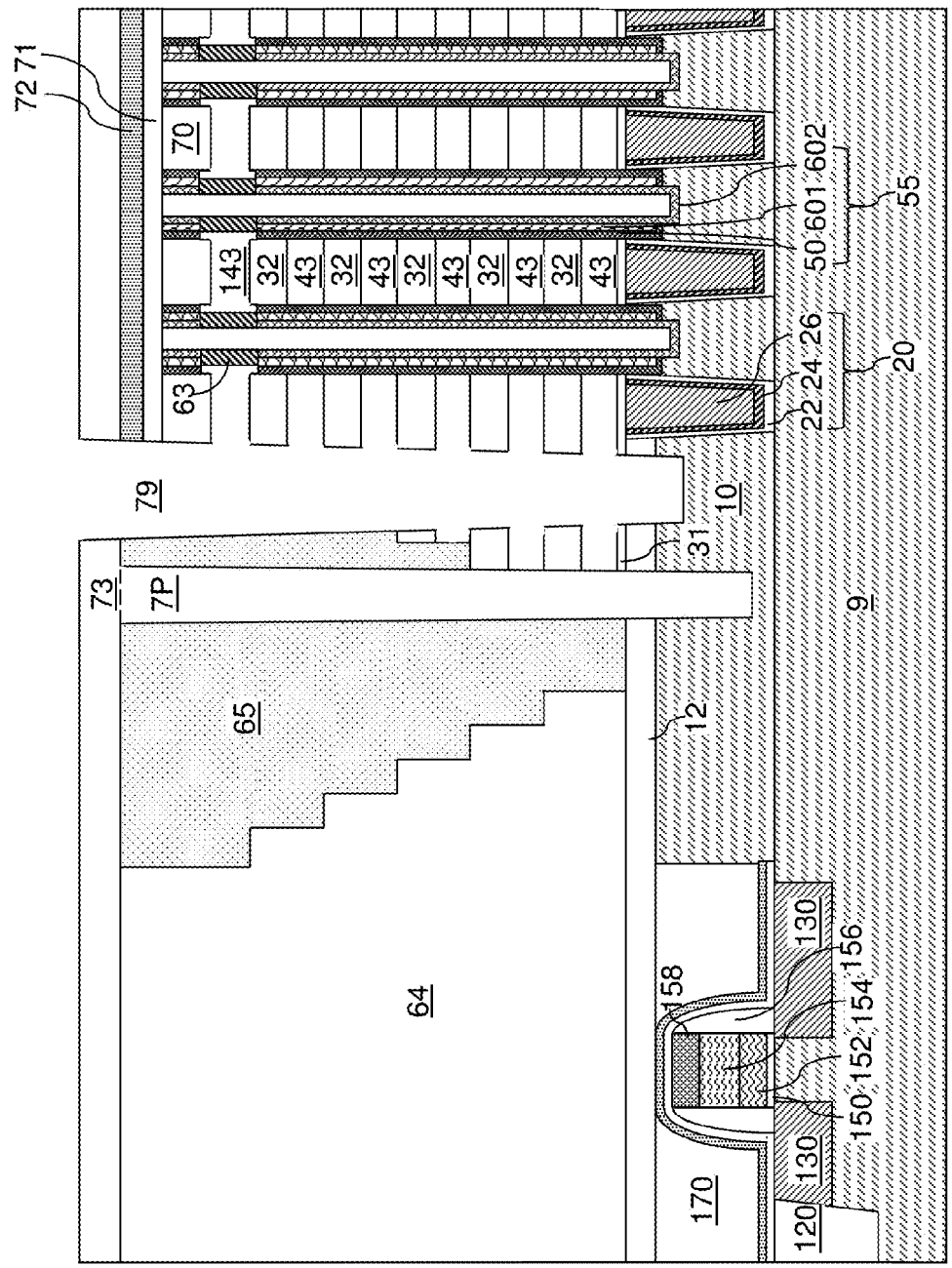
FIG. 8 is a vertical cross-sectional view of the exemplary structure after formation of a backside via cavity and backside recesses according to an embodiment of the present disclosure.

Referring to FIG. 8, a second etchant that selectively etches the second material of the sacrificial material layers 42 with respect to the first material of the insulator layers 32 and the material of the drain regions 63 can be introduced into the at least one backside contact trench 79, for example, employing an etch process. Backside recesses 43 are formed in volumes from which the sacrificial material layers 42 are removed. The backside recesses are second backside recesses that are located underneath the first backside recess, i.e., the drain-level backside recess 143. The removal of the second material of the sacrificial material layers 42 can be selective to the first material of the insulator layers 32, the material of the at least one dielectric support pillar 7P, the material of the retro-stepped dielectric material portion 65, and the semiconductor material of the semiconductor material layer 10. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as germanium, and the materials of the insulator layers 32, the at least one dielectric support pillar 7P, and the retro-stepped dielectric material portion 65 can be selected from silicon oxide, silicon nitride, and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Figure 9A:
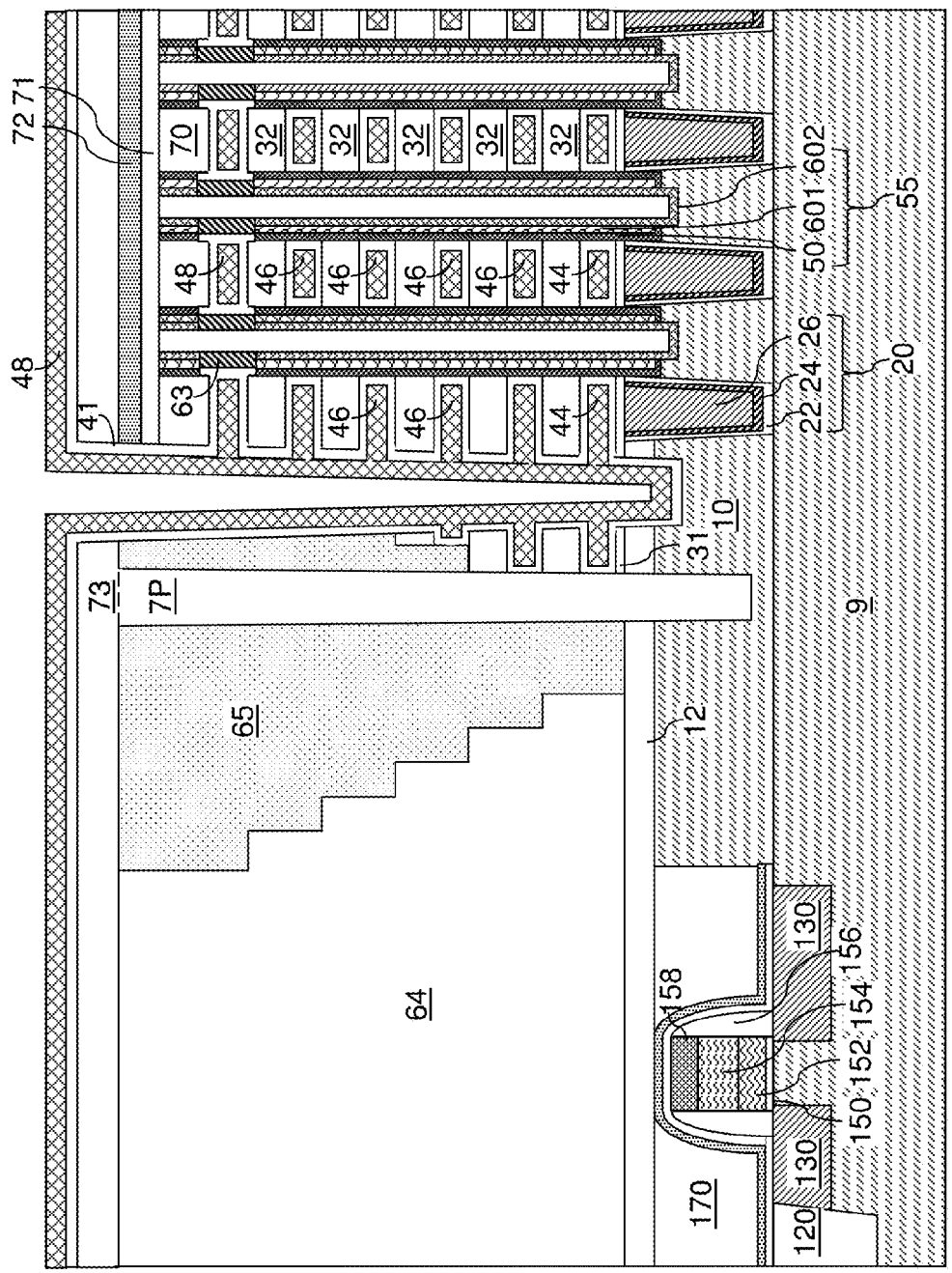
FIG. 9A is a vertical cross-sectional view of the exemplary structure after formation of a blocking dielectric layer and electrically conductive layers according to an embodiment of the present disclosure.
Figure 9B:
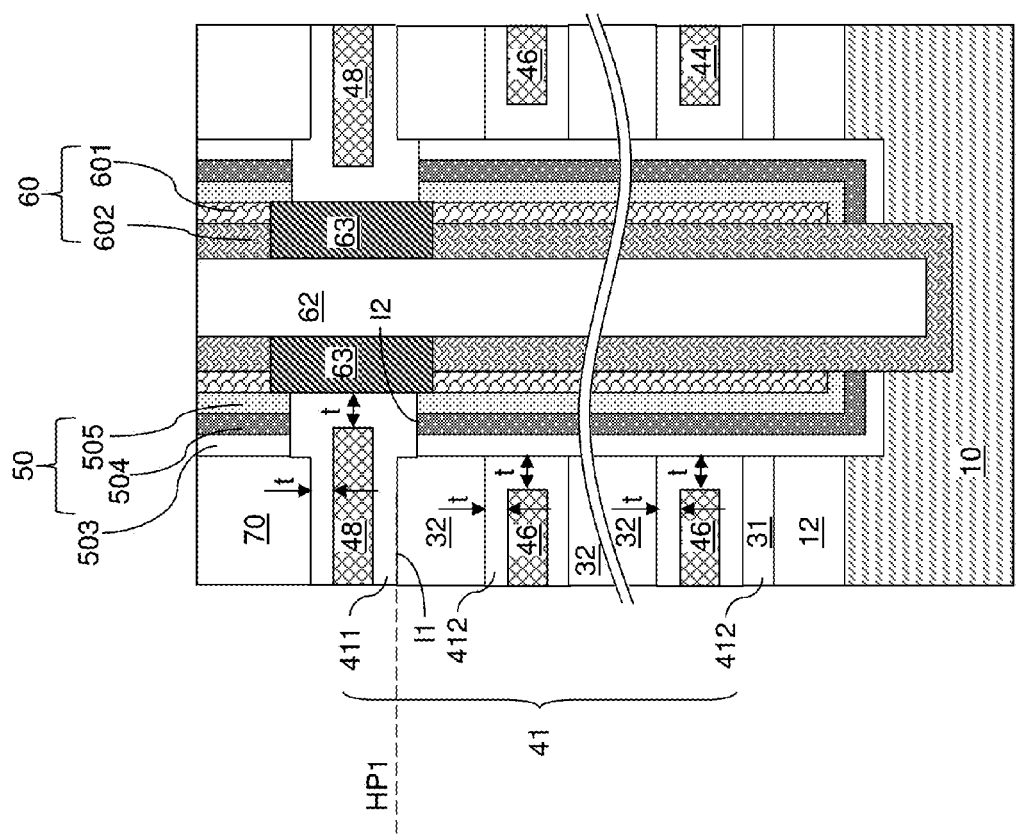
FIG. 9B is a vertical cross-sectional view of a memory stack structure within the exemplary structure illustrated in FIG. 9A.

Referring to FIGS. 9A and 9B, the drain-level backside recess 143 and the plurality of recesses 43 can be simultaneously filled with a combination of a dielectric liner and a conductive material. Specifically, a dielectric material is deposited to form a contiguous dielectric liner, which is employed to block leakage of electrical charges from the charge storage elements 504 to drain select gate electrode layers to be subsequently formed within the volume of the drain-level backside recess 143 and/or to control gate electrode layers to be subsequently formed within the volumes of the backside recesses 43. The contiguous dielectric liner is herein referred to as a backside blocking dielectric layer 41. The backside blocking dielectric layer 41 includes a dielectric material such as silicon oxide, a dielectric metal oxide, silicon nitride, or a combination thereof. In one embodiment, the backside blocking dielectric layer 41 can include a stack of a silicon oxide layer and a dielectric metal oxide layer. The backside blocking dielectric layer 41 can be deposited by a conformal deposition method such as low pressure chemical vapor deposition (LPCVD), atomic layer deposition (ALD), or a combination thereof. The thickness t of the backside blocking dielectric layer 41 is less than one half of the height of the backside recesses 43, and is less than one half of the height of the drain-level backside recess 143. In one embodiment, the thickness t of the backside blocking dielectric layer 41 can be in a range from 3 nm to 20 nm, although lesser and greater thicknesses can also be employed.

Around each memory opening, the backside blocking dielectric layer 41 is formed on a sidewall of the drain region 63 at a level of the temporary material layer, and on a sidewall of the memory film 50 at each level of the sacrificial material layers. Around each annular cavity 143 located around a memory opening, the backside blocking dielectric layer 41 is formed on a top surface of a remaining portion of the memory film 50 (which is located under a horizontal plane including the top surface of the topmost insulator layer 32), and on a bottom surface of another remaining portion of the memory film 50 (which is located above a horizontal plane including the bottom surface of the insulating cap layer 70).

Subsequently, a conductive material can be deposited in the remaining cavities of the plurality of backside recesses 43, in the remaining cavity of the drain-level backside recess 143, on the sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 and the drain-level backside recess 143 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 and the drain-level backside recess 143 can be selected from tungsten and a combination of titanium nitride and tungsten. In one embodiment, the conductive material can be deposited by chemical vapor deposition.

A plurality of electrically conductive layers 46 can be formed in the plurality of backside recesses 43, another electrically conductive layer can be formed in the drain-level backside recess 143, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). The plurality of insulator layers 32 and the plurality of electrically conductive layers 46 collectively constitute an alternating plurality (32, 46) of insulator layers 32 and electrically conductive layers 46. The electrically conductive layer that is formed in the drain-level backside recess 143 is herein referred to a drain-level electrically conductive layer 48, and can function as a drain select gate electrode. Thus, each sacrificial material layer 42 can be replaced with an electrically conductive layer 46, and the temporary material layer 142 can be replaced with a drain-level electrically conductive layer 48.

A first dielectric liner portion 411 of the backside blocking dielectric layer 41 at the drain level can be in contact with a drain region 63. A first conductive electrode, i.e., the drain select electrode as embodied as the drain-level electrically conductive layer 48, can be embedded in the first dielectric liner portion 411. A second dielectric liner portion 412 of the backside blocking dielectric layer 41 can be laterally spaced from the semiconductor channel 60 by a memory film 50. A second conductive electrode, i.e., a control gate electrode as embodied as an electrically conductive layer 46, can be embedded in the second dielectric liner portion 412. The first dielectric liner portion 411 and the second dielectric liner portion 412 have the same thickness and the same composition in case the backside blocking dielectric layer 41 is formed by a conformal deposition method.

A first lateral spacing between the first conductive electrode, i.e., the drain select electrode as embodied as the drain-level electrically conductive layer 48, and an outer sidewall of the drain region 63 is the same as a first lateral thickness, i.e., the thickness t, of the first dielectric liner portion 411. A second lateral spacing between the second conductive electrode i.e., a control gate electrode as embodied as an electrically conductive layer 46, and an outer sidewall of the semiconductor channel 60 is greater than a second lateral thickness, i.e., the thickness t, of the second dielectric liner portion 412. In one embodiment, the second lateral spacing between the second conductive electrode i.e., a control gate electrode as embodied as an electrically conductive layer 46, and the outer sidewall of the semiconductor channel 60 can be the same as the sum of the second lateral thickness, i.e., the thickness t, of the second dielectric liner portion 412, and the thickness of the memory film 50. Thus, the second lateral spacing can be greater than the first lateral spacing by the thickness of the memory film 50.

In one embodiment, the memory film 50 can comprise a tunneling dielectric 505, a charge storage element 504 embodied as a charge trapping layer and laterally surrounding the tunneling dielectric 505, and at least one blocking dielectric 502 laterally surrounding the charge trapping layer, wherein the second lateral spacing is equal to a sum of the first lateral spacing and the thickness of the memory film 50. In one embodiment, the thickness of the memory film 50 can be the same as the sum of the thickness of the tunneling dielectric 505, the thickness of the charge storage element 504, and the thickness of the at least one blocking dielectric 502.

In one embodiment, the first dielectric liner portion 411 can contact a top surface of the at least one blocking dielectric 502 and a top surface of the charge trapping layer. In one embodiment, the at least one blocking dielectric 502 can contact a sidewall of each second dielectric liner portion 412 and a bottom surface of the first dielectric liner portion 411. In one embodiment, a first interface I1 between the first dielectric liner portion 411 and a top surface of the topmost insulator layer 32 within the alternating stack (32, 46) of insulating layers 32 and electrically conductive layers 46 can be located within a horizontal plane HP1 that is located above a second interface I2 between the first dielectric liner portion 411 and the portion of the memory film 50 extending through the alternating stack (32, 46). A vertical extent of the first dielectric liner portion 411 can be greater over the memory film 50 than over a region of the insulator layers 32 within the stack (32, 46).

Figure 10:
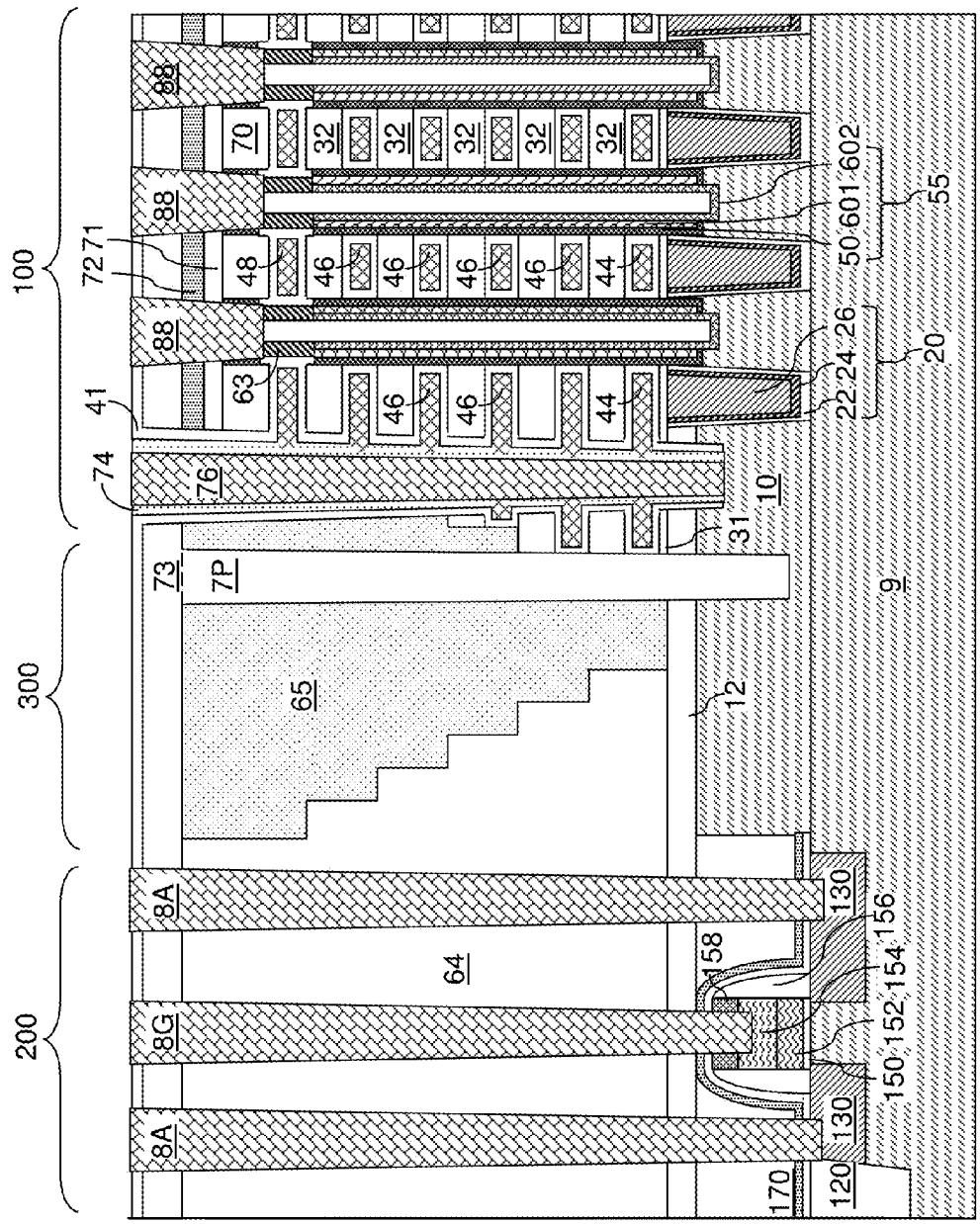
FIG. 10 is a vertical cross-sectional view of the exemplary structure after formation of a backside contact spacer and a backside contact via structure according to an embodiment of the present disclosure.

Referring to FIG. 10, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices. The drain-level electrically conductive layer 48 can function as a plurality of drain select gate electrodes for multiple memory stack structures 55 and a drain select gate line electrically connecting the plurality of drain select gate electrodes.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73, the at least one dielectric cap layer (71, 72), upper portions of the dielectric cores 62, and optionally remaining portions of the memory film 50 located above the top surfaces of the drain regions 63. Each drain contact via cavity can extend downward from the top surface of the horizontal portion of the backside blocking dielectric layer 41 located above the dielectric pillar material layer 73, or, if the horizontal portion of backside blocking dielectric layer 41 is removed collaterally during recessing of the contiguous conductive material layer 46L, from the top surface of the dielectric pillar material layer 72 or from the top surface of the at least one dielectric cap layer (71, 72). Each drain contact via cavity extends at least to the top surface of an underlying drain region 63.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Further, control gate contact via structures 8C can be formed within each contact via cavity that extends to a top surface of the electrically conductive layers 46 in the contact region 300. At least one drain select gate contact via structure 8U can be formed within a contact via cavity that extends to a top surface of the drain-level electrically conductive layers 48 in the contact region 300.

Similarly, drain contact via structures 88 can be formed to provide electrical contact to the drain regions 63. Each drain contact via structure 88 can extend through the entirety of the at least one dielectric cap layer (71, 72), the entirety of the dielectric pillar material layer 73 (if present), and the topmost horizontal portion of the backside blocking dielectric layer 41 (if present). Each drain contact via structure 88 further extends at least through an upper portion of a memory opening between the horizontal plane including the top surface of the insulating cap layer 70 and the horizontal plane including the top surfaces of the drain regions 63.

Figure 11A:
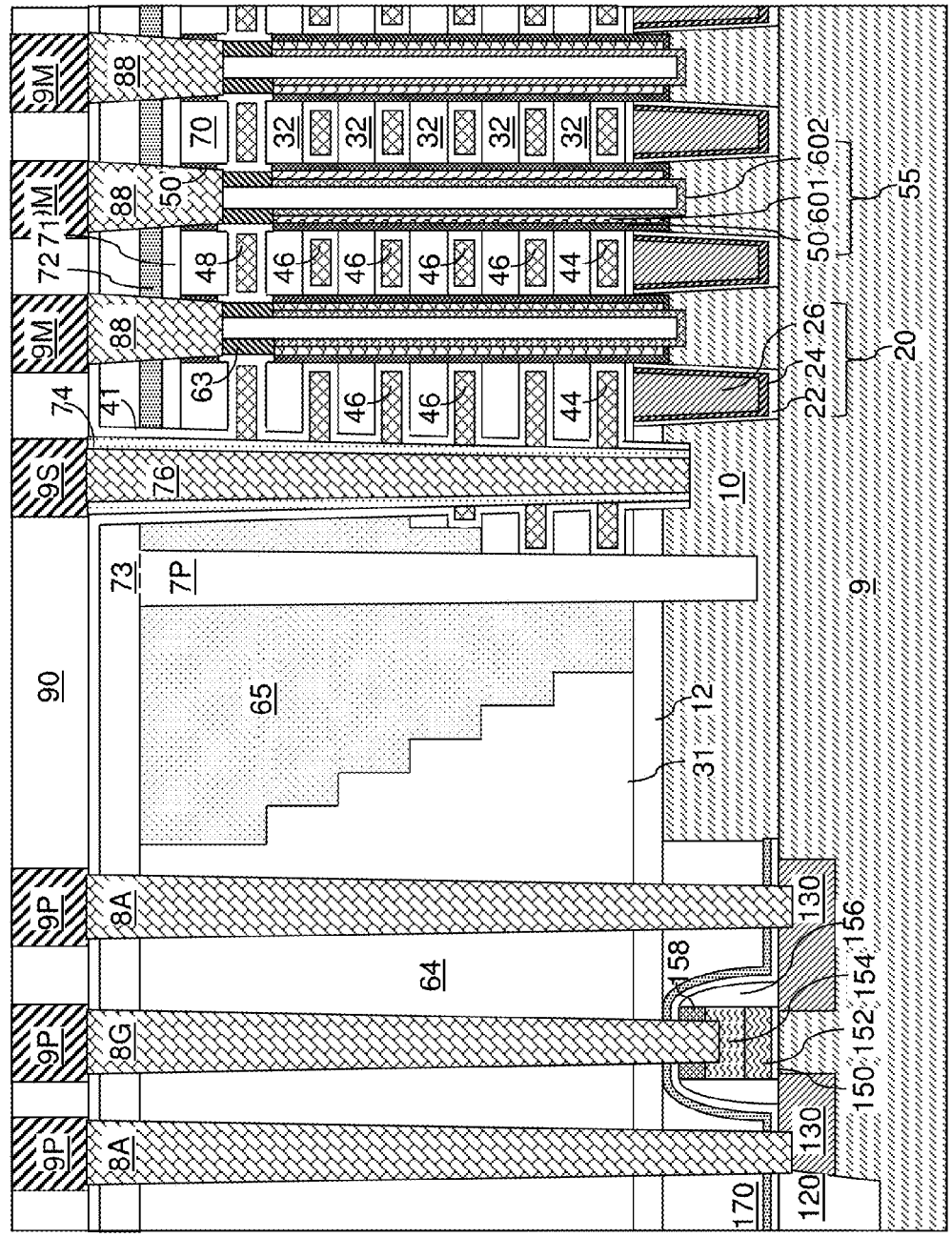
FIGS. 11A and 11B are vertical cross-sectional views of the exemplary structure after formation of conductive line structures according to an embodiment of the present disclosure.
Figure 11B:
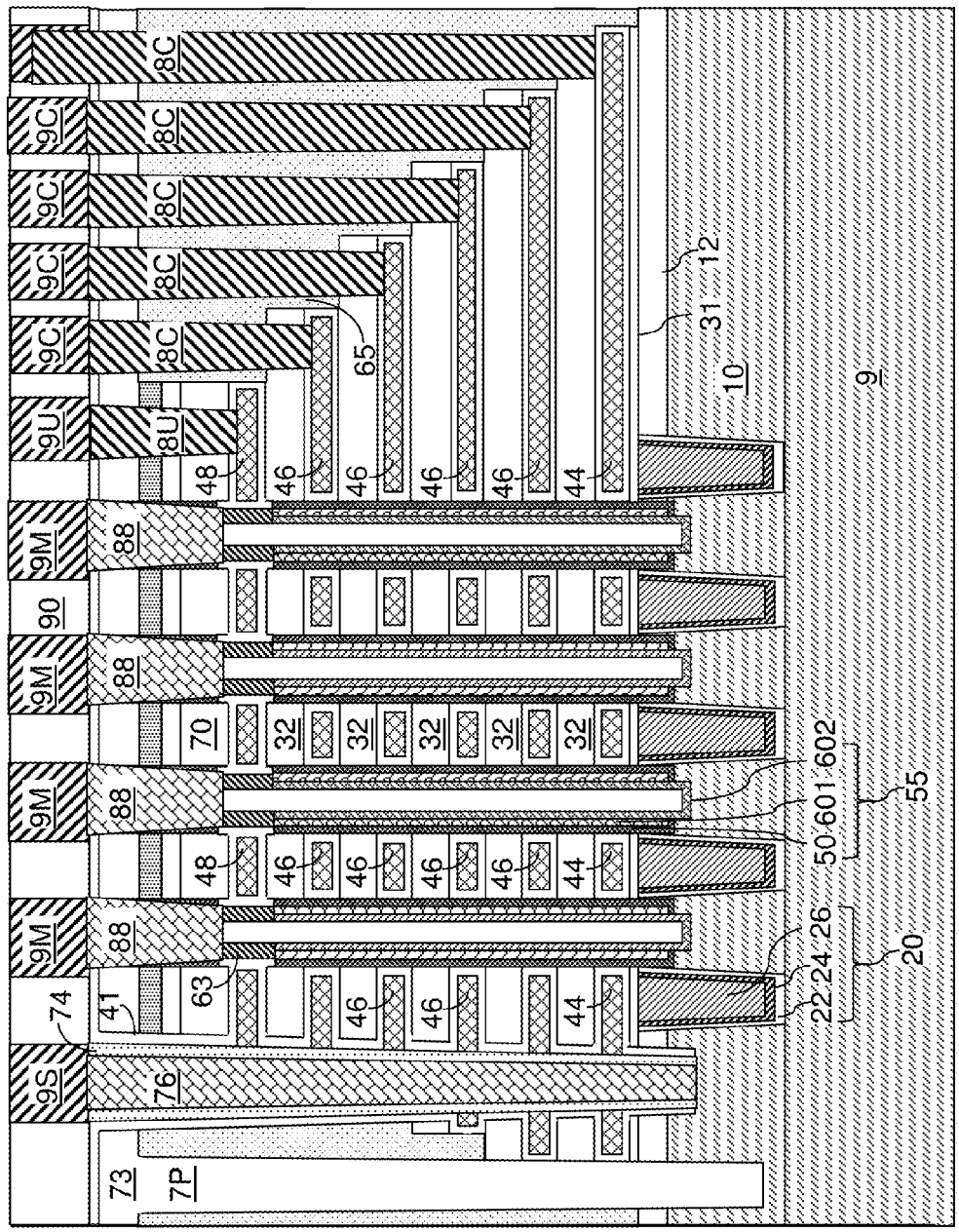

Referring to FIGS. 11A and 11B, a line-level dielectric layer 90 can be formed over the dielectric pillar material layer 73. The line-level dielectric layer 90 can include silicon oxide, organosilicate glass., silicon nitride, and/or a dielectric metal oxide The thickness of the line-level dielectric layer 90 can be in a range from 30 nm to 1,000 nm, although lesser and greater thicknesses can also be employed.

Various conductive line structures 92 can be formed in the line-level dielectric layer 90 to provide electrical contact to the various contact via structures (76, 8G, 8A, 88, 8C, 8U). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory film 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10. A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element.

An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

A contact via structure, e.g., a drain contact via structure 88, can be in contact with a top surface of an underlying drain region 63. Each remaining portion of the memory film 50 above the drain regions can comprise a dielectric material portion having a same composition as a portion of the memory film 50 that is present underneath the first dielectric liner portion 411 (See FIG. 9B), can contact a top surface of a drain region 63, and can laterally contact the drain conductive via structure 88. Each drain contact via structure 88 can extend partially into a memory opening, and can contact at least a top surface of an underlying drain region 63. Each drain region 63 can have the same horizontal cross-sectional area as a vertical portion of the semiconductor channel 60. The electrical dopants that are present in the drain region 63 is herein referred to as electrical dopants of a first conductivity type, which can be p-type or n-type. The drain region 63 can include the same semiconductor material as the vertical portion of the semiconductor channel 60.

Figure 12:
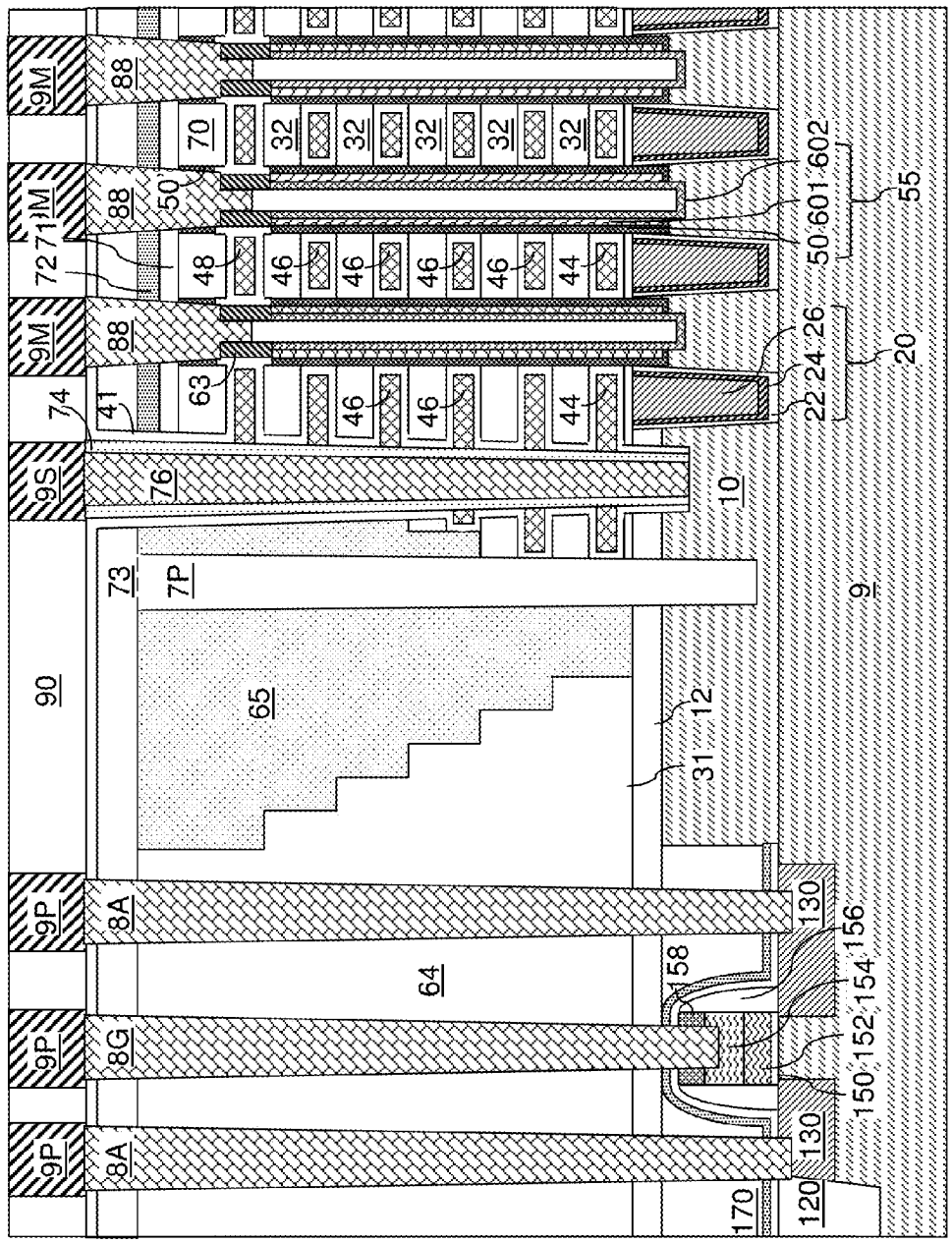
FIG. 12 is a vertical cross-sectional view of an alternative embodiment of the exemplary structure according to an embodiment of the present disclosure.

Referring FIG. 12, an alternative embodiment of the exemplary structure according to an embodiment of the present disclosure is illustrated. The drain contact via cavities can extend further downward than the topmost surfaces of the drain regions 63. In one embodiment, the anisotropic etch that forms the drain contact via cavities can be selective to the semiconductor material of the drain regions 63. In this case, the anisotropic etch can recess the dielectric material of the dielectric core to a height that is below the horizontal plane including the top surfaces of the drain regions 63.

The drain contact via structure 88 can be formed with stepped surfaces. In this case, each drain contact via structure 88 can be formed on an inner sidewall of a drain region 63. Each drain contact via structure 88 can extend partially into a memory opening, and can contact a top surface and an inner sidewall of an underlying drain region 63.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a three-dimensional memory structure, comprising:
   forming a stack of alternating layers comprising first material layers and second material layers over a substrate;
   forming a temporary material layer over the stack;
   forming a memory opening through the temporary material layer and the stack;
   forming a memory film and a semiconductor channel in the memory opening;
   forming a first backside recess by removing the temporary material layer and a portion of the memory film that adjoins the temporary material layer, wherein a portion of a sidewall of the semiconductor channel is physically exposed to the first backside recess;
   introducing electrical dopants through the physically exposed portion of the sidewall of the semiconductor channel and into a portion of the semiconductor channel, which is converted into a drain region
   forming a trench through the temporary material layer and the stack;
   removing a material of second material layers to form second backside recesses; and
   simultaneously filling the first and second backside recesses with a combination of a dielectric liner and a conductive material;
   wherein:
   the first backside recess is formed prior to formation of the second backside recesses;
   the dielectric liner is formed on a sidewall of the drain region at a level of the temporary material layer, and on a sidewall of the memory film at each level of the second material layer; and
   the dielectric liner is formed on a top surface of a remaining portion of the memory film, and on a bottom surface of another remaining portion of the memory film.

2. The method of claim 1, wherein the portion of the semiconductor channel is doped with the electrical dopants by a plasma doping process.

3. The method of claim 1, wherein the temporary material layer comprises a semiconductor material and the second material layers comprise a dielectric material.

4. The method of claim 1, wherein the temporary material layer is formed between an underlying dielectric material layer and an overlying dielectric material layer, and the portion of the memory film that adjoins the temporary material layer is isotropically etched to expand the first backside recess above a horizontal plane including a bottom surface of the overlying dielectric material layer and below another horizontal plane including a top surface of the underlying dielectric material layer.

5. The method of claim 1, further comprising forming a contact via structure that extends partially into the memory opening and contacting a top surface of the drain region.

6. The method of claim 5, wherein the contact via structure is formed on an inner sidewall of the drain region.

7. The method of claim 1, further comprising:
- forming a device over the substrate, wherein the device comprises a vertical NAND device located in a device region; and
- forming at least one electrically conductive layer in the stack that comprises, or is electrically connected to, a word line of the NAND device.

8. The method of claim 7, wherein:
- the substrate comprises a silicon substrate;
- the NAND device comprises array of monolithic three dimensional NAND strings over the silicon substrate;
- at least one memory cell in a first device level of the three dimensional array of three dimensional NAND strings is located over another memory cell in a second device level of the array of three dimensional NAND strings;
- the silicon substrate contains an integrated circuit comprising a driver circuit for the memory device located thereon; and each NAND string comprises:
- a plurality of semiconductor channels, wherein at least one end portion of each of the plurality of semiconductor channels extends substantially perpendicular to a top surface of the semiconductor substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *